United States Patent
Miyashita et al.

(10) Patent No.: US 12,042,915 B2
(45) Date of Patent: Jul. 23, 2024

(54) DRIVING TOOL

(71) Applicant: MAKITA CORPORATION, Anjo (JP)

(72) Inventors: Isao Miyashita, Anjo (JP); Hiroto Shimomae, Anjo (JP); Hideki Matsushima, Anjo (JP)

(73) Assignee: MAKITA CORPORATION, Anjo (JP)

( * ) Notice: Subject to any disclaimer, the term of this patent is extended or adjusted under 35 U.S.C. 154(b) by 0 days.

(21) Appl. No.: 17/847,582

(22) Filed: Jun. 23, 2022

(65) Prior Publication Data

US 2024/0131673 A1   Apr. 25, 2024

(30) Foreign Application Priority Data

Aug. 6, 2021   (JP) .................. 2021-129632

(51) Int. Cl.
| | |
|---|---|
| C23C 14/04 | (2006.01) |
| B25C 1/04 | (2006.01) |
| C23C 14/06 | (2006.01) |
| C23C 14/34 | (2006.01) |

(52) U.S. Cl.
CPC .............. *B25C 1/047* (2013.01); *C23C 14/04* (2013.01); *C23C 14/0641* (2013.01); *C23C 14/34* (2013.01)

(58) Field of Classification Search
CPC ......... B25C 1/047; C23C 14/04; C23C 14/06; C23C 14/34
See application file for complete search history.

(56) References Cited

U.S. PATENT DOCUMENTS

| | | | | |
|---|---|---|---|---|
| 4,337,300 A | * | 6/1982 | Itaba | C23C 30/005 428/629 |
| 5,573,335 A | * | 11/1996 | Schinazi | G01K 7/04 73/104 |
| 5,947,021 A | * | 9/1999 | Coleman | H05K 3/1233 101/120 |
| 2008/0179371 A1 | * | 7/2008 | Gardner | B25C 5/15 227/1 |
| 2011/0188659 A1 | * | 8/2011 | Khalid | H04L 9/0852 380/278 |

FOREIGN PATENT DOCUMENTS

| | | |
|---|---|---|
| JP | S55-175080 U | 12/1980 |
| JP | 2018-111157 A | 7/2018 |

* cited by examiner

*Primary Examiner* — Nathaniel C Chukwurah
(74) *Attorney, Agent, or Firm* — Oliff PLC

(57) ABSTRACT

A base material is subjected to a low-temperature tempering treatment at a temperature equal to or less than 300° C. After the tempering treatment, a coating is applied to the base material by a sputtering method.

20 Claims, 5 Drawing Sheets

DRIVING TOOL

CROSS-REFERENCE TO RELATED APPLICATIONS

This application claims priority to Japanese patent application serial number 2021-129632, filed on Aug. 6, 2021, the contents of which are incorporated herein by reference in their entirety for all purposes.

BACKGROUND

The present disclosure generally relates to a hand-held driving tool for driving a driving member, such as a nail or a staple, into a floor material, a plaster board, etc. at a construction site, etc.

The above-mentioned types of driving tools may each comprise a driver. The drive may be moved owing to a gas pressure of compressed gas or a biasing force of a compression spring for striking a driving member. The driving member stricken by the driver may be driven into a workpiece by passing through a driving nose. The driver may have a long and thin bar shape. The driver may require certain characteristics, such as high hardness and toughness. Because of these requirements, the driver may be manufactured of a suitable steel material (base material) that is then subjected to a heat treatment and/or a surface treatment, such as a coating applied to the material.

For example, a titanium nitride (TiN) coating may be applied to a surface of a high-speed tool steel that is used for a base material of the driver. As another example, a plurality of base materials may be combined along a longitudinal direction to form a driver with the hardness and toughness required for each portion of the driver in the longitudinal direction.

SUMMARY

As an example of a coating applied to a single base material for manufacturing a driver, a titanium nitride (TiN) coating may be applied to the surface of, for example, a high-speed tool steel (SKH) or a die steel (SKD). High-speed tool steel and die steel may be subjected to a tempering treatment at high temperatures, normally 550° C. or more. Also, the titanium nitride coating may be applied at high temperatures of approximately 500° C. Cutting or grinding, which are expensive and/or labor intensive processes, of a base material made from the high-speed tool steel or the die steel, which are expensive materials, may be performed to manufacture the driver. As a result, the overall cost of producing the driver increases in cost. Additionally, since the titanium nitride coating is applied to a material that was tempered at temperatures higher than that needed to form the titanium nitride coating, the hardness and toughness acquired by tempering may not decrease. As a result, the driver manufactured by the above-described procedures may obtain high hardness and toughness. However, because of the high cost of the base material and manufacturing methods, there is a need for manufacturing a driver that has the required hardness, toughness, and wear resistance, but uses an inexpensive base material.

One feature of the present disclosure relates to a driver that is provided in a driving tool and is used to drive a driving member. The driver comprises a base material. A coating is applied to a surface of the base material by sputtering.

Another feature of the present disclosure relates to a manufacturing method of a driver that is to be provided in a driving tool and to be used to drive a driving member. The manufacturing method comprises a step of tempering a steel at a temperature equal to or less than 300° C. to form a base material. The manufacturing method further comprises a step of applying a coating to a surface of the base material by sputtering at a temperature equal to or less than 300° C.

Since the coating is applied by sputtering, an inexpensive steel tempered at low temperatures of, for example, 150° C. to 200° C., can be used as the base material. For example, the base material can be produced by punching an inexpensive steel and tempering it at low temperatures. As a result of the subsequent coating, the base material can obtain the required hardness and toughness. Due at least in part to the low manufacturing temperatures, the driver can be manufactured at a reduced cost.

A sputtering method, which is one of physical vapor deposition (PVD) method, can be performed at low temperatures, for example 180° C. to 300° C. By using a sputtering method, a titanium nitride (TiN) coating or a chromium nitride (CrN) coating can be applied to surfaces of the base material. As a result, the surfaces of the base material can have a Vickers hardness of 1000 or more. Accordingly, the driver can obtain the required high hardness and wear resistance. A less expensive material and/or relatively softer material, such as steel, a cast iron material, an aluminum alloy, a magnesium alloy, or other material, can be used as the base material.

DETAILED DESCRIPTION

The detailed description set forth below, when considered with the appended drawings, is intended to be a description of exemplary embodiments of the present disclosure, and is not intended to be restrictive and/or to represent the only embodiments in which the present disclosure can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the disclosure. It will be apparent to those skilled in the art that the exemplary embodiments of the disclosure may be practiced without these specific details. In some instances, these specific details refer to well-known structures, components, and/or devices that are shown in block diagram form in order to avoid obscuring significant aspects of the exemplary embodiments presented herein.

According to one aspect of the present disclosure, the base material is a steel that has been subjected to a low-temperature tempering treatment. Accordingly, the base material can be obtained by using an inexpensive material.

According to one aspect of the present disclosure, the coating is a titanium nitride coating or a chromium nitride coating. Accordingly, the surface of the driver can have the required hardness and wear resistance.

According to one aspect of the present disclosure, the coating is applied to only an area of equal to or less than 10 mm of a tip end of the base material as measured in its longitudinal direction. Accordingly, the hardness and wear resistance can be efficiently obtained at a required location of the driver, while avoiding forming the coating in other areas.

According to one aspect of the present disclosure, a thickness of the tip end of the base material is less than 1.0 mm. Accordingly, a driver that is capable of driving a thin pin with a thickness of about 0.6 mm can be produced at a reduced cost.

According to one aspect of the present disclosure, the manufacturing method further comprises a step of punching tempered steel to form a base material. Furthermore, the coating is applied to only a tip end of the base material by sputtering. Accordingly, the driver can have the required hardness, toughness, and wear resistance, while also having a reduced cost.

According to one aspect of the present disclosure, a driving tool may comprise the above-described driver, or a driver manufactured by the above-described method. Accordingly, durability of the driving tool can be improved while also reducing its cost.

Figure 1:
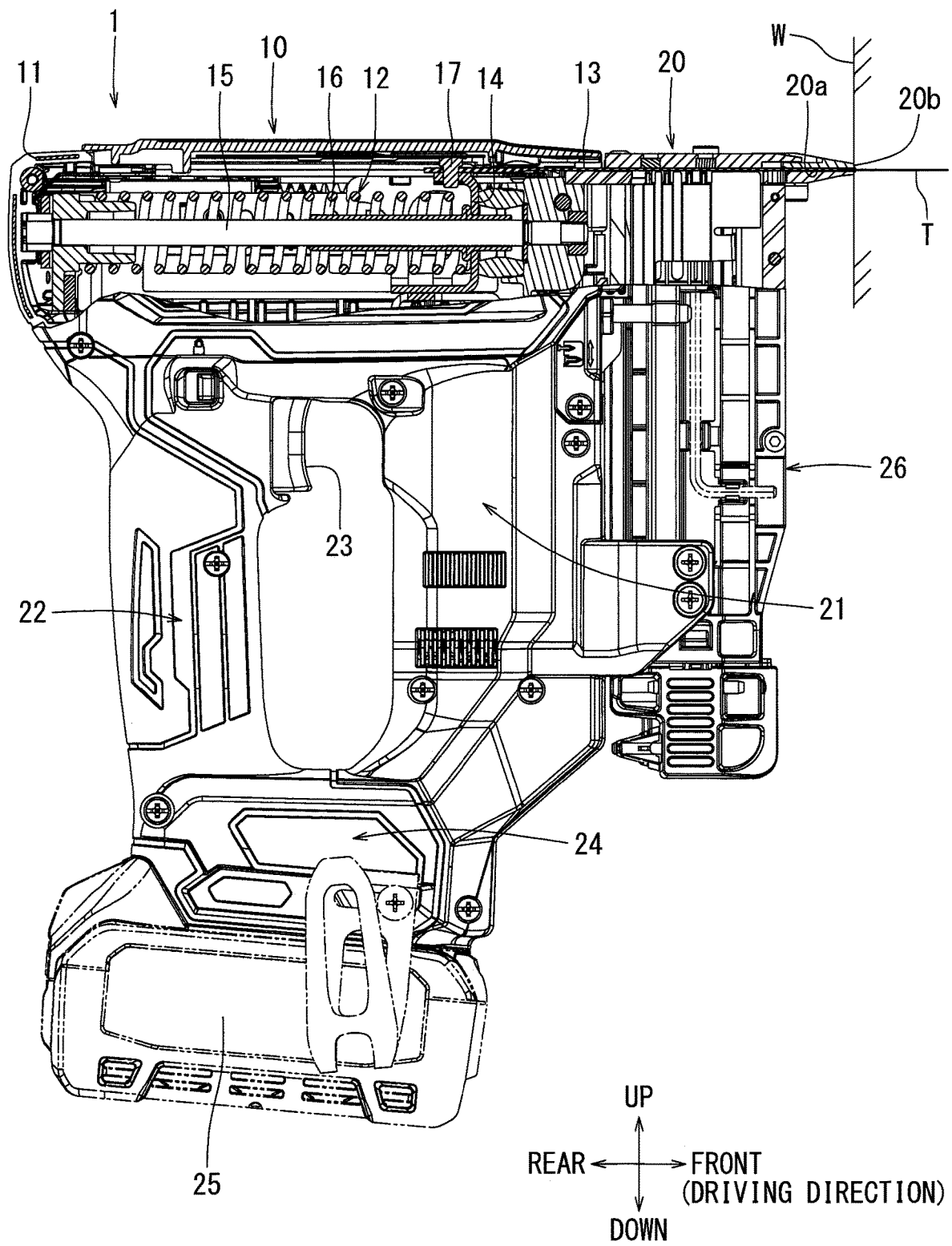
FIG. 1 is an overall right side view of a driving tool, a part of which is cut out to show an internal structure of a tool main body.

FIG. 1 shows a mechanical-spring type rechargeable pin tacker as an example of a driving tool 1. The driving tool 1 may utilize a biasing force of a compression spring as a striking force (driving force). The driving tool 1 may include a tool main body 10. Also, the tool main body 10 may include a tubular main body housing 11 in which a driving mechanism 12 is housed.

The driving mechanism 12 may include a driver 13 for driving a driving member T, a base 14 for supporting the driver 13, a guide bar 15 for movably supporting the base 14 in a front-rear direction, and a spring 16 for biasing the base 14 in a driving direction. A rear portion of the driver 13 may be connected to an upper portion of the base 14 via a connecting pin 17.

The tool main body 10 may include a driving nose 20 at a front portion of the tool main body 10. The driving nose 20 may guide the driver 13 in the driving direction. A front portion of the driver 13 may be arranged within a driving passage 20a of the driving nose 20. The base 14 may move forward at least in part due to the biasing force of the spring 16. In accordance with the movement of the base 14 in a forward direction, the driver 13 may move forward within the driving passage 20a. A driving member T may be driven by the driver 13 that moves within the driving passage 20a in the forward direction. The driving member T driven by the driver 13 may be ejected from an ejection port 20b and be driven into a workpiece W.

A driving section 21 and a grip 22 may be disposed at a lower portion of the tool main body 10. The driving section 21 and the grip 22 may protrude in a downward direction. Though not shown in the figures, a driver lift mechanism may be housed along a lower portion of the driving mechanism 12. The driver lift mechanism may be activated by an electric motor housed in the driving section 21. The base 14 may be moved in the rearward direction and against the biasing force of the spring 16 by the activation of the driver lift mechanism. The driver 13 may be returned toward its starting position by moving in the rearward direction together with the base 14. After the driver 13 has been moved to a rearward end position, the driver lift mechanism may disengage from the base 14. As a result, the driver 13 may move at least in part due to the biasing force of the spring 16 so as to perform a driving operation.

A user may hold the grip 22. A trigger 23, which may be configured for the user to perform a pull operation, may be disposed at an upper front portion of the grip 22. After the trigger 23 has been pulled and/or a predetermined condition is present, the electric motor in the driving section 21 may be activated to perform a driving operation. In the present embodiment, a front side may refer to a driving direction of the driving tool 1. A rear side may refer to a direction opposite to the driving direction. A left side and a right side may be based on a position of the user holding the grip 22.

A battery attachment portion 24 may be disposed straddling an area between a lower portion of the driving section 21 and a lower portion of the grip 22. A battery pack 25 may be attached along a lower surface of the battery attachment portion 24. The battery pack 25 may be a lithium-ion battery and may be repeatedly used by removing it from the battery attachment portion 24 and recharging it by use of a dedicated charger.

A magazine 26 may be combined with the driving nose 20. The magazine 26 may extend long in the downward direction from a lower surface of the driving nose 20 and may extend along a front side of the driving section 21. The magazine 26 may be loaded with a plate-shaped combined driving member that comprises a plurality of driving members T temporarily mounted parallel to each other. The loaded combined driving member may be pitch-fed to a side of the driving nose 20 in accordance with a driving operation of the tool main body 10. In this way, the driving members T may be supplied one-by-one to be within the driving passage 20a.

Figure 2:
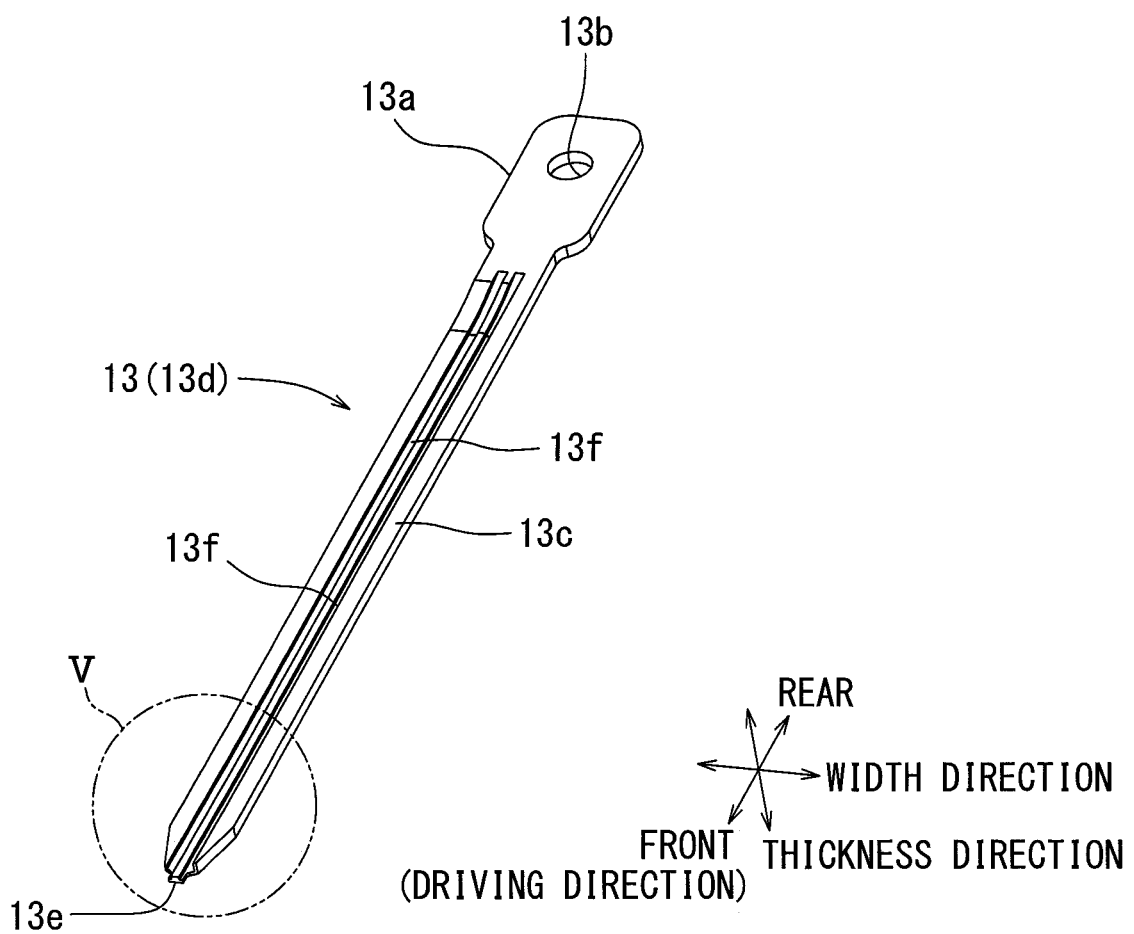
FIG. 2 is a perspective view of a driver.
Figure 3:
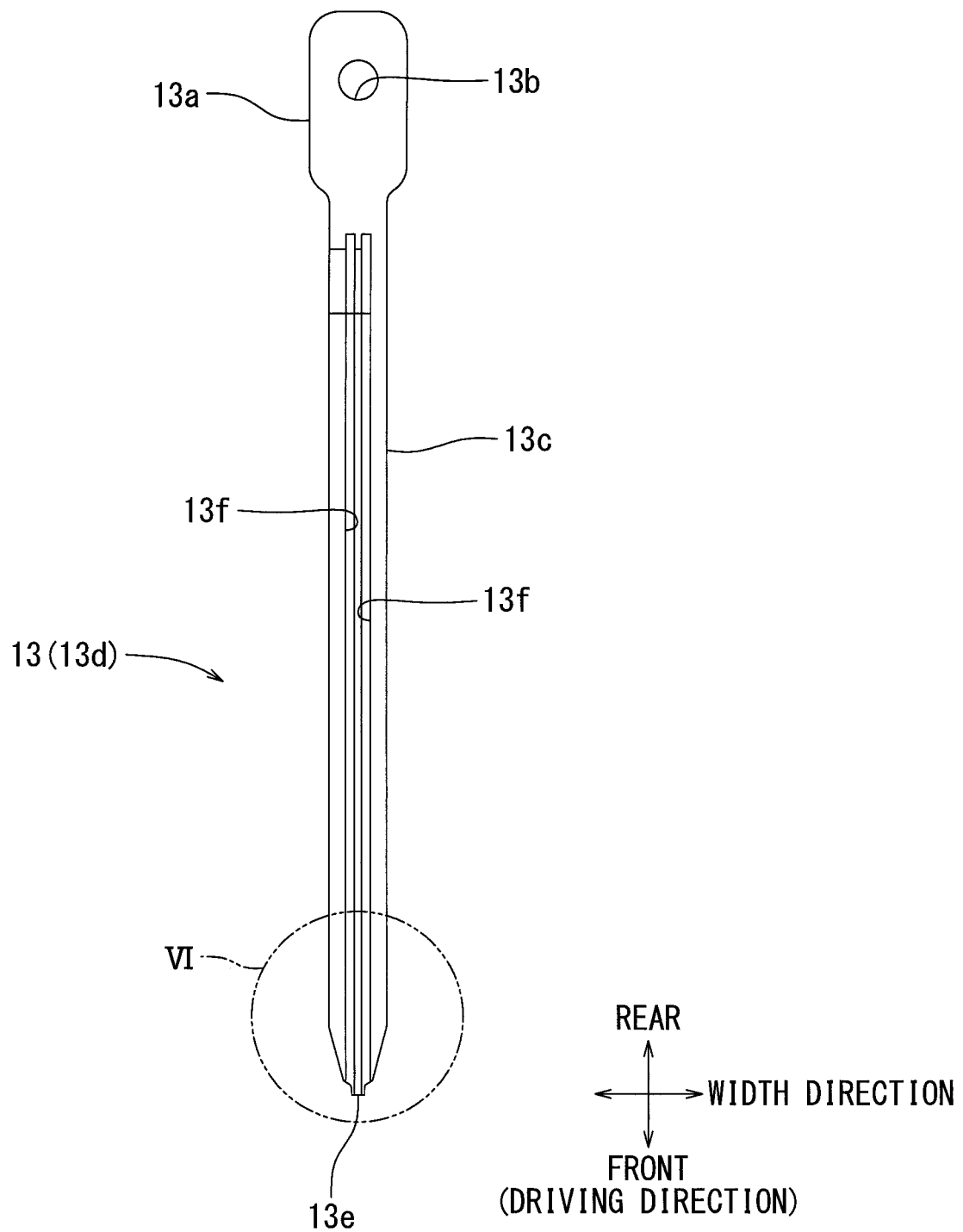
FIG. 3 is a plan view of the driver.
Figure 4:
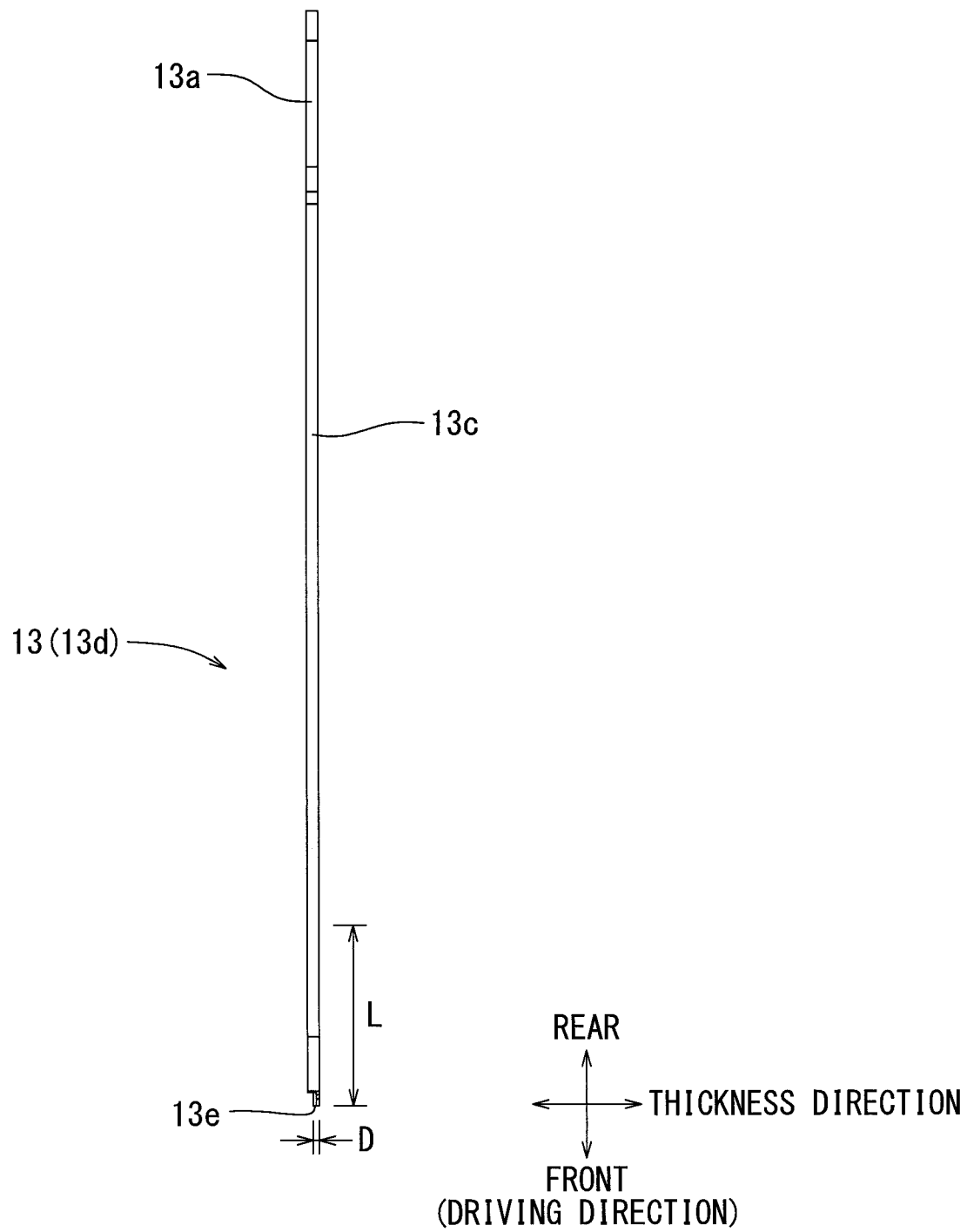
FIG. 4 is a side view of the driver.

The driver 13 of the present disclosure may have certain features. FIGS. 2-4 shows an embodiment of the driver 13 as a single body. As shown in the figures, regarding the directions of the driver 13, a longitudinal direction of the driver 13 may be referred to as a front-rear direction. A left-right direction may be referred to as a width direction. Furthermore, an up-down direction may be referred to as a thickness direction (or a plate thickness direction). As can be seen in the figures, the front-rear direction of the driver 13 may correspond to the front-rear direction of the driving tool 1.

The driver 13 may be long in the front-rear direction and may generally have a plate-like shape. In the present disclosure, the driver 11 may have a reduced cost in comparison with a conventional driver. As shown in FIGS. 2 and 3, the driver 13 may include a long main body 13c and a connection base 13a that is integrally formed at a rear of the main body 13c. The connection base 13a may be wider than the main body 13c in the width direction. The connection base 13a may include a connection hole 13b at approximately a center of the connection base 13a. The connection pin 17 may be inserted into the connection hole 13b. The connection base 13a may contact an upper surface of the base 14. The connection base 13a may be linked to the upper surface of the base 14 via the connection pin 17. The connection base 13a may be linked to the upper surface of the base 14 while contacting the upper surface of the base 14. The main body 13c, which may be narrower than the connection base 13a in the width direction, may extend in the forward direction from a front of the connection base 13a. The main body 13c may be disposed extending from the base 14 in the forward direction. A front portion (tip end) of the main body 13c may be arranged within the driving passage 20a.

A steel plate may be used as a base material 13d. The driver 13 may be manufactured by applying a coating to the base material 13d by ways of sputtering. Conventionally, a high-speed tool steel or a die steel, both of which are expensive, would have been used for the base material of a conventional driver. However, in the present disclosure, a material that is much cheaper than high-speed tool steel and/or die steel, such as, for example, a carbon steel, may be used for the base material 13d. The base material 13d may be produced, for example, by punching carbon steel using a press mold.

Figure 5:
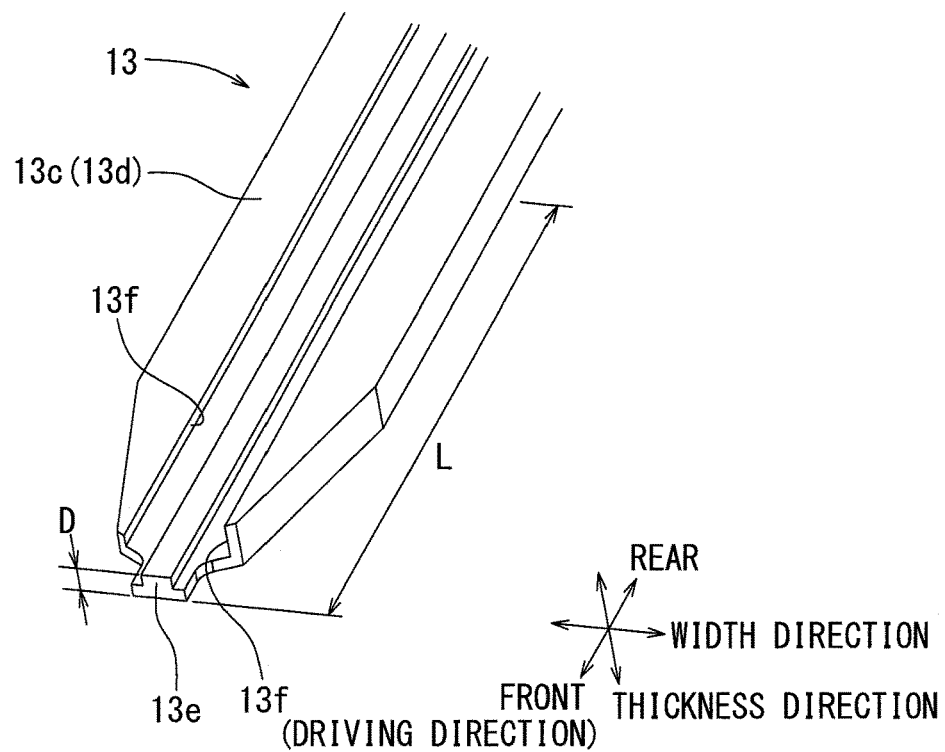
FIG. 5 is an enlarged view of a part V of FIG. 2, showing a perspective view of a tip end of the driver.
Figure 6:
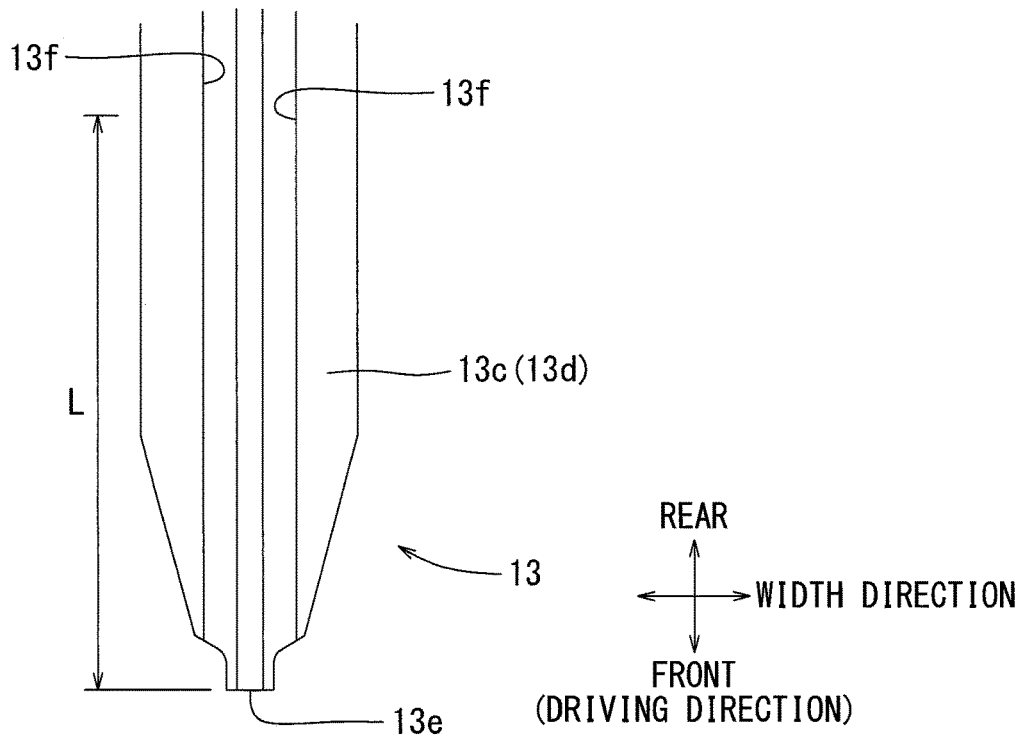
FIG. 6 is an enlarged view of a part VI of FIG. 3, showing a plan view of the tip end of the driver.

As shown in FIG. 5, two grooves 13f may both be formed on one side surface of the base material 13d. The two grooves 13f may be formed to have a rectangular cross-sectional shape and to extend parallel to each other while being spaced apart by a fixed distance. As shown in FIGS. 2 and 3, the two grooves 13f may extend along almost the entire length of the main body 13c in its longitudinal direction. The two grooves 13f may serve to guide the driver 13 as it travels in the driving passage 20a.

If the base material 13d is made from a carbon steel, it may be subjected to a quenching treatment at temperatures of about 800° C. to 850° C. After quenching, the base material 13d may be subjected to a tempering treatment at low temperatures, for examples temperatures of about 180° C. to 300° C. By quenching and tempering, the base material 13d may have a favorable hardness and toughness. Furthermore, in order to improve surface hardness and/or wear resistance of the base material 13d while maintaining the hardness and toughness, a coating may be applied to the base material 13d.

After the heat treatment, a coating may be applied to the base material 13d by a sputtering method. Sputtering is one form of a physical vapor deposition (PVD) method. Using the sputtering method, a coating, such as a titanium nitride (TiN) coating or a chromium nitride (CrN) coating, may be applied to one or more surface of the base material 13d. As a result, the surface(s) of the base material 13d may have a Vickers hardness of 1000 or more. Sputtering may be performed at low temperatures, for example temperatures of about 180° C. to 300° C. Since the treatment temperature for sputtering is selected such that it is the same or lower than the tempering temperature, the hardness and toughness of the base material 13d, which was obtained by tempering, may not decrease. Thus, the surface hardness (wear resistance) of the base material 13d may be improved while maintaining the hardness and toughness of the base material 13d.

In the present embodiment, the coating formed by sputtering may be applied to only an area (coating area L) corresponding to or less than 10 mm of a tip end of the base material 13d in its longitudinal direction. However, the coating area L may be more than 10 mm.

Referring to FIG. 5, a thickness D of a tip end 13e of the driver 13 (the base material 13d of the driver 13) may be, for example, 0.6 mm. The thickness D of the tip end 13e may correspond to the driving passage 20a having a small opening width, which allows for guiding a very thin driving member T having a width of, for example, 0.6 mm. The thickness D of the tip end 13e may be less than or equal to 1.0 mm, preferably 0.5 to 0.7 mm. If the thickness D of the tip end 13e is greater than 1.0 mm, the excessive damage to the workpiece W may occur.

According to the driving tool 1 of the present embodiment, which may be configured as above, the driver 13 may have a reduced cost in comparison with a conventional driver. The driver 13 may be manufactured through application of a coating to the base material 13d using a sputtering method. Sputtering may be performed at relatively low temperatures (e.g., about 180° C. to 300° C.). Because of this, a carbon steel, which is inexpensive and has relatively low tempering temperatures, may be used for the base material. As a result, the driver 13 may not only have the required hardness, toughness, and wear resistance, it may also have a reduced cost.

The base material 13d may be produced by punching a carbon steel using a press mold. In this respect, the driver 13 may be furthermore reduced in cost in comparison with a conventional driver, which is manufactured by cutting and/or grinding a high-speed tool steel.

In the exemplified embodiment, the coating is applied by sputtering to an area (coating area L) corresponding to equal to or less than 10 mm of the tip end of the main body 13c of the driver 13 in its longitudinal direction. Since the coating, which may be relatively expensive, may be applied to only a required portion of the main body 13c of the driver 13, the driver 13 may have a reduced cost.

The exemplified embodiment discussed above may be modified in various ways. In the exemplified embodiment, a carbon steel is used as the base material 13d. However, other materials, which are relatively inexpensive and can be tempered at temperatures equal to or lower than the treatment temperature used for sputtering, may be used for the base material 13d. For example, instead of a carbon steel, an alloy steel such as a chromium-molybdenum steel, a cast iron material such as a ductile cast iron, or an alloy such as an aluminum alloy or a magnesium alloy may be used for the base material 13d.

The coating, which is formed by the sputtering method, may be applied to the base material 13d in a wider area than that of the exemplified coating area L. The coating may be applied to an entirety of the base material 13d.

The coating, which is formed by the sputtering method, may be made of a material other than chromium nitride (CrN) or titanium nitride (TiN).

In the exemplified embodiment, the base material 13d may be produced by punching. However, the base material 13d may be produced by cutting and/or grinding.

In the exemplified embodiment, a mechanical-spring type pin tacker, which is powered by a rechargeable battery pack 25, is exemplified as the driving tool 1. The exemplified driver 13 may be widely applied to a gas-spring type tacker, a compressed-air-drive-type tacker, a nail driver, or any other type of driving tools.

The exemplified driving tool 1 may be one example of a driving tool according to one aspect of the present disclosure. The exemplified driver 13 may be one example of a driver according to one aspect of the present disclosure. The exemplified base material 13d may be one example of a base material according to one aspect of the present disclosure. The exemplified sputtering processed at low temperatures of about 180° C. to 300° C. may be one example of sputtering according to one aspect of the present disclosure.

What is claimed is:

1. A driver that is provided in a driving tool and is configured to be used to drive a driving member, comprising:
   a base material; and
   a coating that is applied to a surface of the base material by sputtering,
   wherein the coating is applied to only an area of the base material having a length equal to or less than 10 mm as measured from a tip end of the base material in its longitudinal direction.

2. The driver according to claim 1, wherein the base material is a steel that has been subjected to a low-temperature tempering treatment.

3. The driver according to claim 2, wherein the tempering treatment was performed at a temperature equal to or less than 300° C.

4. The driver according to claim 2, wherein the sputtering was performed at a temperature equal to or less than a temperature at which the steel was tempered.

5. The driver according to claim 2, wherein the base material is formed by punching the tempered steel.

6. The driver according to claim 1, wherein the coating is a titanium nitride coating or a chromium nitride coating.

7. The driver according to claim 1, wherein a thickness of the tip end of the base material is less than 1.0 mm.

8. A driving tool, comprising:
the driver according to claim 1.

9. The driver according to claim 1, wherein the base material is formed of a material other than a high-speed tool steel and a die steel.

10. The driver according to claim 1, wherein the sputtering was performed at a temperature equal to or less than 300° C.

11. A manufacturing method of a driver that is to be provided in a driving tool and used to drive a driving member, comprising the steps of:
tempering a steel at a temperature equal to or less than 300° C. to form a base material;
applying a coating to a surface of the base material by sputtering at a temperature equal to or less than 300° C.; and
punching the tempered steel to produce the base material,
wherein the coating is applied to only a tip end of the base material by the sputtering.

12. A driving tool, comprising:
the driver manufactured by the method recited in claim 11.

13. The manufacturing method of the driver according to claim 11, wherein the temperature of the sputtering is equal to or less than the temperature of the tempering.

14. The manufacturing method of the driver according to claim 11, wherein the steel is neither a high-speed tool steel nor a die steel.

15. The manufacturing method of the driver according to claim 11, wherein the coating is a titanium nitride coating or a chromium nitride coating.

16. The manufacturing method of the driver according to claim 11, wherein the coating is applied to only an area of base material having a length equal to or less than 10 mm as measured from the tip end of the base material in its longitudinal direction.

17. A driver that is provided in a driving tool and is configured to be used to drive a driving member, comprising:
a base material; and
a coating that is applied to a surface of the base material by sputtering,
wherein a thickness of the tip end of the base material is less than 1.0 mm.

18. The driver according to claim 17, wherein the base material is a steel that has been subjected to a low-temperature tempering treatment.

19. The driver according to claim 17, wherein the coating is a titanium nitride coating or a chromium nitride coating.

20. A driving tool, comprising:
the driver according to claim 17.

* * * * *